United States Patent
Cho

(10) Patent No.: US 7,781,969 B2
(45) Date of Patent: Aug. 24, 2010

(54) PLASMA DISPLAY DEVICE AND FRONT FILTER

(75) Inventor: Young Min Cho, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 348 days.

(21) Appl. No.: 11/843,959

(22) Filed: Aug. 23, 2007

(65) Prior Publication Data
US 2008/0100215 A1  May 1, 2008

(30) Foreign Application Priority Data
Oct. 25, 2006  (KR) ............... 10-2006-0104053

(51) Int. Cl.
*H01J 17/49* (2006.01)
*H01J 61/40* (2006.01)
*H01K 1/30* (2006.01)
*H01K 1/26* (2006.01)
(52) U.S. Cl. ................................ 313/582; 313/112
(58) Field of Classification Search ............ 313/112, 313/582
See application file for complete search history.

(56) References Cited

U.S. PATENT DOCUMENTS

| 4,779,025 A * | 10/1988 | Paynton et al. ............. 313/478 |
| 6,160,349 A * | 12/2000 | Nagai ......................... 315/85 |
| 2002/0033661 A1* | 3/2002 | Sugimachi et al. .......... 313/479 |
| 2006/0145578 A1* | 7/2006 | Park et al. ................... 313/112 |

FOREIGN PATENT DOCUMENTS

KR  10-2004-0068662 A  8/2004

* cited by examiner

*Primary Examiner*—Toan Ton
*Assistant Examiner*—Britt D Hanley
(74) *Attorney, Agent, or Firm*—Sughrue Mion, PLLC

(57) ABSTRACT

A plasma display device has a reduced number of components, thereby lowering manufacturing costs, improving productivity of assembly, and reducing a weight thereof. The display device includes a PDP module; a front frame positioned in front of the PDP module and having an opening; a rear cover covering a rear side of the PDP module to shield electromagnetic waves; a front filter positioned to face the opening of the front frame to shield the electromagnetic waves; and a shielding member positioned along a periphery of the PDP module to shield the electromagnetic waves. The front filter has a rear side supported by the PDP module.

9 Claims, 4 Drawing Sheets

PLASMA DISPLAY DEVICE AND FRONT FILTER

CROSS-REFERENCE TO RELATED APPLICATION

This application claims the benefit under 35 U.S.A. §119 of Korean Patent Application No. 2006-0104053, filed on Oct. 25, 2006 in the Korean Intellectual Property Office, the disclosure of which is incorporated herein by reference.

BACKGROUND OF THE INVENTION

1. Field of the Invention

The present invention relates to a plasma display device, and, more particularly, to a plasma display device, which has an improved support structure for a front filter and an improved electromagnetic shielding structure.

2. Description of the Related Art

Plasma display devices refer to flat panel display devices which employ plasma display panels. Although the plasma display device is thinner than conventional cathode-ray-tube (CRT) display devices, it suffers from larger power consumption and higher electromagnetic interference than CRT display devices. Thus, it is necessary for the plasma display device to have means for shielding electromagnetic waves from being leaked to the outside.

One of the electromagnetic shielding structures for the plasma display device is disclosed in Korean Patent Laid-open No. 2004-0068662. The display device of the disclosure includes a front frame having an opening, a PDP module positioned inside the front frame, a glass filter positioned to face the opening of the front frame to prevent leakage of electromagnetic waves generated from the PDP module towards a screen, a plurality of aluminum filter supporters positioned along a periphery of the PDP module to support the glass filter and to shield the electromagnetic waves from being leaked through the periphery of the PDP module, and an aluminum back cover to cover a rear side of the PDP module. The filter supporters are secured to the front frame by means of a plurality of screws to support a periphery of the glass filter.

For this display device, the electromagnetic waves generated from the PDP module are shielded by the glass filter, the filter supporters, and the rear cover. That is, the front side, the periphery and the rear side of the PDP module are shielded by the glass filter, the metallic filter supporters, and the metallic back cover, respectively.

However, since such a display device must be provided with the plural filter supporters to secure the glass filter, and the plural screws to secure the plural filter supporters to the front frame, the display device has a number of components, which leads to not only an increase in manufacturing costs but also a reduction in productivity of assembly. Furthermore, since the filter supporters are composed of aluminum, the conventional display device has a problem of heavy weight.

SUMMARY OF THE INVENTION

Illustrative, non-limiting exemplary embodiments of the present invention overcome the above disadvantages, and other disadvantages not described above.

Therefore, it is an aspect of the invention to provide a plasma display device which has a reduced number of components, thereby lowering manufacturing costs while improving productivity of assembly.

It is another aspect of the invention to provide the plasma display device which is reduced in weight.

Additional aspects and/or advantages of the invention will be set forth in part in the description which follows and, in part, will be obvious from the description, or may be learned by practice of the invention.

An apparatus consistent with the present invention, includes a plasma display device provided with: a PDP module; a front frame positioned in front of the PDP module and having an opening; a rear cover covering a rear side of the PDP module to shield electromagnetic waves; a front filter positioned to face the opening of the front frame to shield the electromagnetic waves; and a shielding member positioned along a periphery of the PDP module to shield the electromagnetic waves, wherein the front filter has a rear side supported by the PDP module.

The shielding member may include a conductive fiber containing a metallic component, and have one end bonded to the front filter and the other end brought into close contact with the rear cover.

The conductive fiber may have a surface on which the metallic component is coated.

The conductive fiber may comprise a woven layer containing the metallic component.

The plasma display device may further include a conductive bonding tape to bond the shielding member to the front filter.

The bonding tape may include a woven layer of the conductive fiber, and an adhesive layer formed on either side of the woven layer and comprising a conductive metal powder.

The plasma display panel may further include an elastic member interposed in a coupling part between the rear cover and the front frame to force the shielding member to be brought into close contact with an inner surface of the rear cover.

The elastic member may be a sponge.

The front frame may include a support rim extending from an inner surface of the front filter to support the periphery of the front filter.

An apparatus consistent with the present invention, may also include a plasma display device provided with: a PDP module; a front frame positioned in front of the PDP module and having an opening; a rear cover covering a rear side of the PDP module to shield electromagnetic waves; a front filter positioned to face the opening of the front frame to shield the electromagnetic waves; and a shielding member positioned along a periphery of the PDP module to shield the electromagnetic waves, the shielding member including a conductive fiber with flexibility and having one end bonded to the front filter and the other end brought into close contact with the rear cover.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
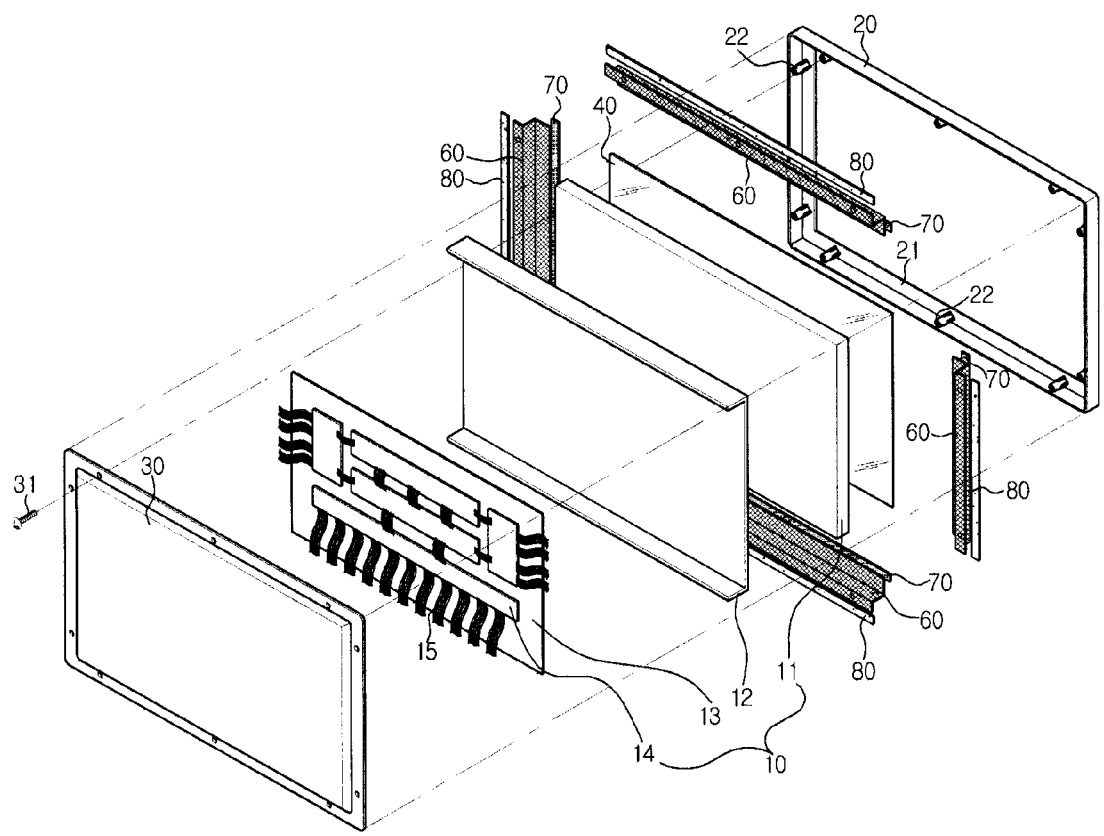
FIG. 1 is an exploded perspective view of a plasma display device according to the present invention.

Reference will now be made in detail to the exemplary embodiments of the present invention, examples of which are illustrated in the accompanying drawings, wherein like reference numerals refer to the like elements throughout the drawings. The exemplary embodiments are described below to explain the present invention by referring to the figures.

Figure 2:
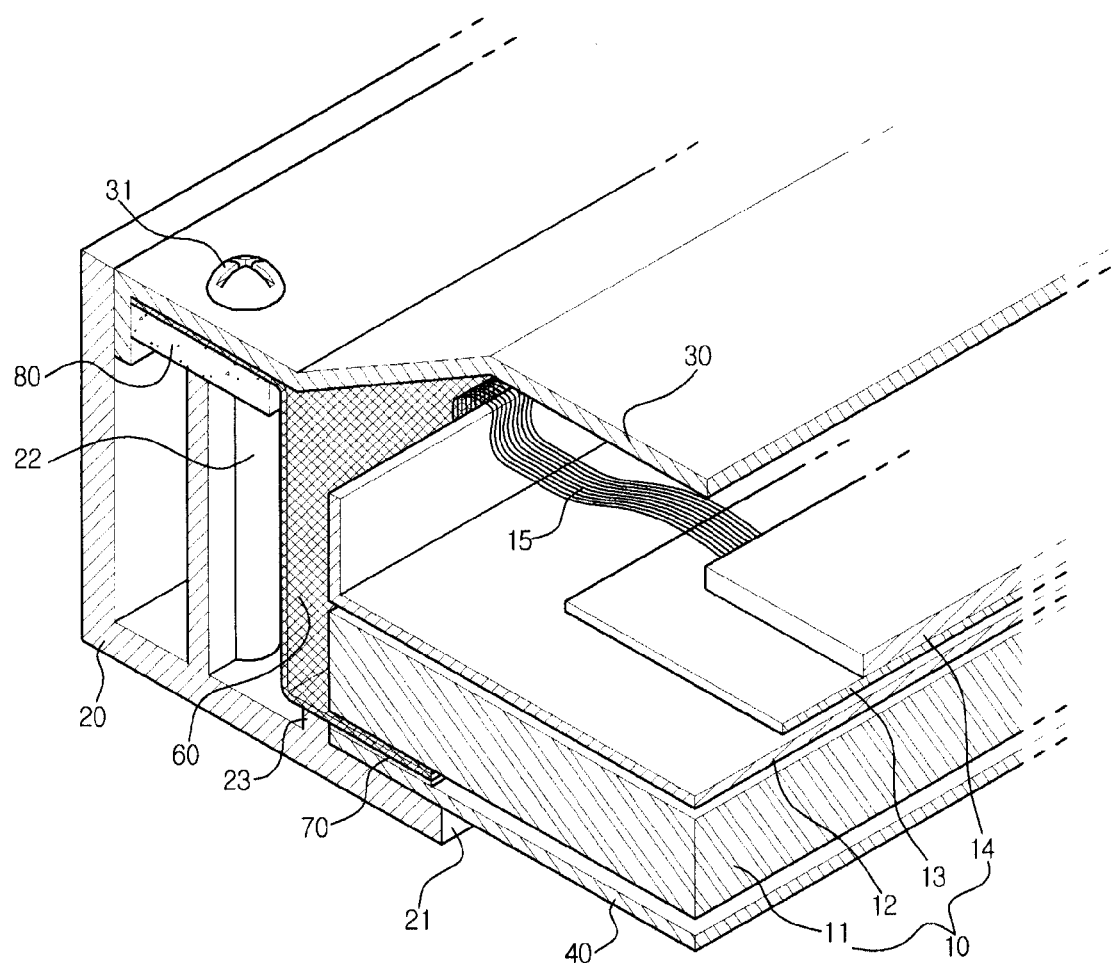
FIG. 2 is an assembled perspective view of the plasma display device according to the present invention, showing a sectional configuration of the plasma display device.
Figure 3:
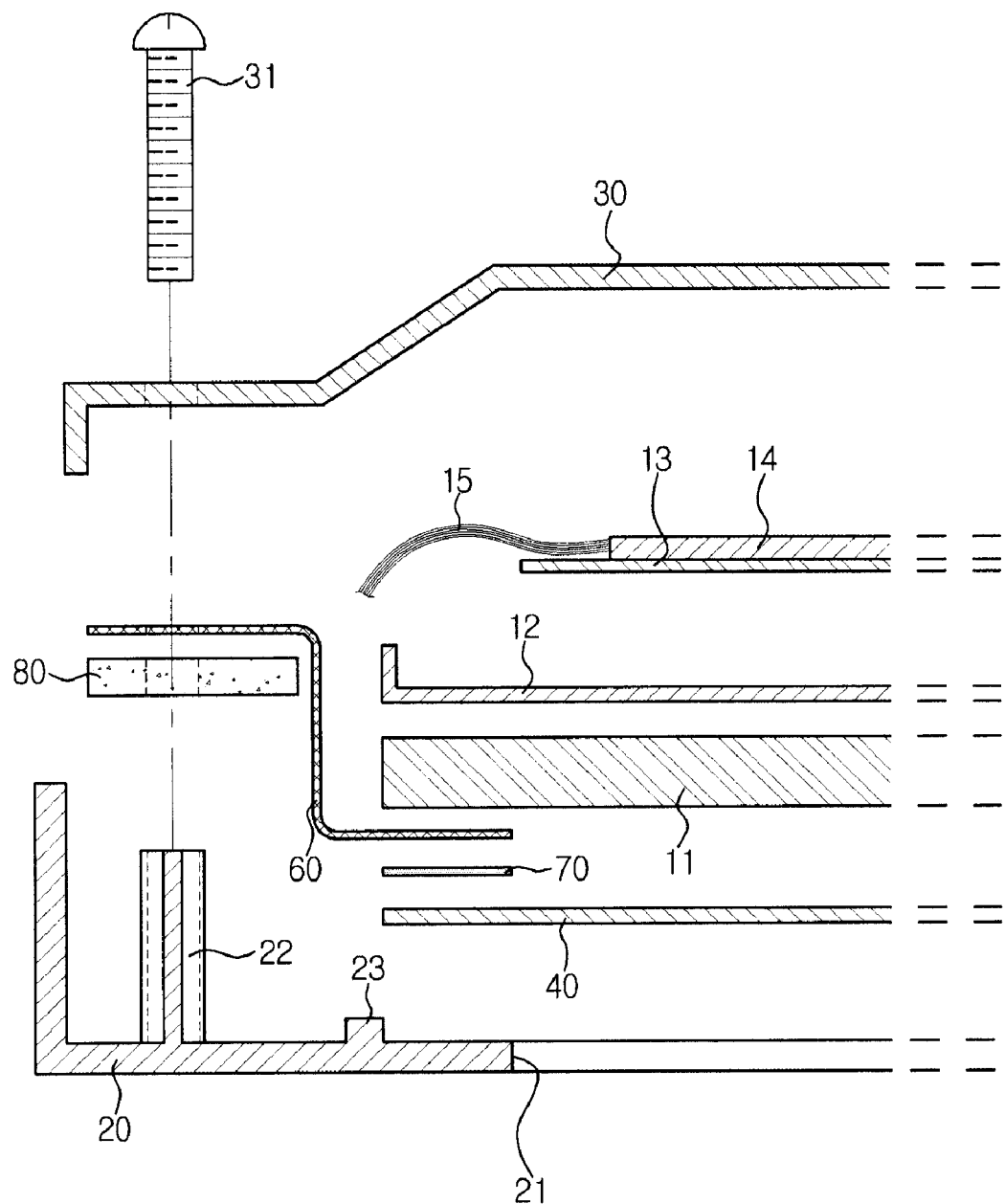
FIG. 3 is a cross-sectional view of the plasma display device in an exploded state.

Referring to FIGS. 1 to 3, the plasma display device according to the present invention comprises a PDP module 10 to realize an image, a front frame 20 and a rear cover 30 to protect the PDP module 10, a front filter 40 in front of the PDP module 10 for electromagnetic shielding, and a plurality of shielding members 60 positioned along a periphery of the PDP module 10 for electromagnetic shielding.

The PDP module 10 comprises a display panel (that is, plasma display panel) 11, a support plate 13 on which a driving circuit board 14 is mounted, and a heat sink sheet 12 interposed between the plasma display panel 11 and the support plate 13. These components are assembled as a single set. The support plate 13 is made of a metallic material having excellent heat dissipation property. The driving circuit board 14 and the display panel 11 are connected by means of plural signal transfer mechanisms 15 such as flexible printed circuits (FPC).

The front frame 20 has an opening 21 formed to expose a screen section, and a plurality of screw fastening bosses 22 formed on an inner surface of the front frame 20 such that the rear cover 30 is coupled to the front frame 20 via the fastening bosses 22. In addition, referring to FIGS. 2 and 3, the front frame 20 is formed with a support rim 23 extending from the inner surface of the front frame 20 to support a periphery of the front filter 40.

The rear cover 30 covers a rear side of the PDP module 10, and is coupled to the front frame 20 by means of screws 31 which are fastened into a periphery of the front frame 20. Specifically, the screws 31 are fastened into the fastening bosses 22 of the front frame 20.

The rear cover 30 serves to shield electromagnetic waves generated from the PDP module 10 from being leaked in the rear direction thereof. For this purpose, the rear cover 30 is made from a metallic material capable of shielding the electromagnetic waves or from a molded resin product which has a conductive material applied to an inner surface of the product. Alternatively, the rear cover 30 may be made from another molded resin product which has a metallic thin film or a metallic plate attached to the inner surface of the product.

The front filter 40 serves to shield the electromagnetic waves generated from the PDP module 10 from being leaked in the front direction thereof. Although not shown in detail, the front filter 40 is formed by attaching a transparent conductive film formed of indium oxide, silver, etc. to a transparent plastic or glass panel. The front filter 40 is electrically connected to the rear cover 30 via the shielding members 60 described below. The front filter 40 serves to protect the PDP module 10 from external impact as well as to shield the electromagnetic waves.

The shielding members 60 serve to shield the electromagnetic waves generated from the PDP module 10 from being leaked through the periphery of the PDP module 10. Referring to FIGS. 2 and 3, the shielding members 60 are formed from a conductive fiber having flexibility. The conductive fiber may be formed by coating metal such as nickel, copper, gold, silver, aluminum, iron, etc, on a fiber woven with polyester, acryl, nylon, silk, etc. Alternatively, the conductive fiber may be formed by weaving a fiber containing a metallic component. Not only can the shielding members 60 be easily mounted on the plasma display device due to the flexibility, but they also reduce the weight of the display device due to light weight.

As show in FIG. 2, each of the shielding members 60 has one end bonded to a rear side of the front filter 40 near the periphery of front filter 40 (so that the one end is disposed in front of the PDP module 10) by means of a bonding tape 70, and the other end brought into close contact with an inner surface of the rear cover 30 near the periphery of the rear cover 30 (in a plane disposed to the rear of the PDP module 10) to prevent leakage of the electromagnetic waves through the periphery of the PDP module 10.

Figure 4:
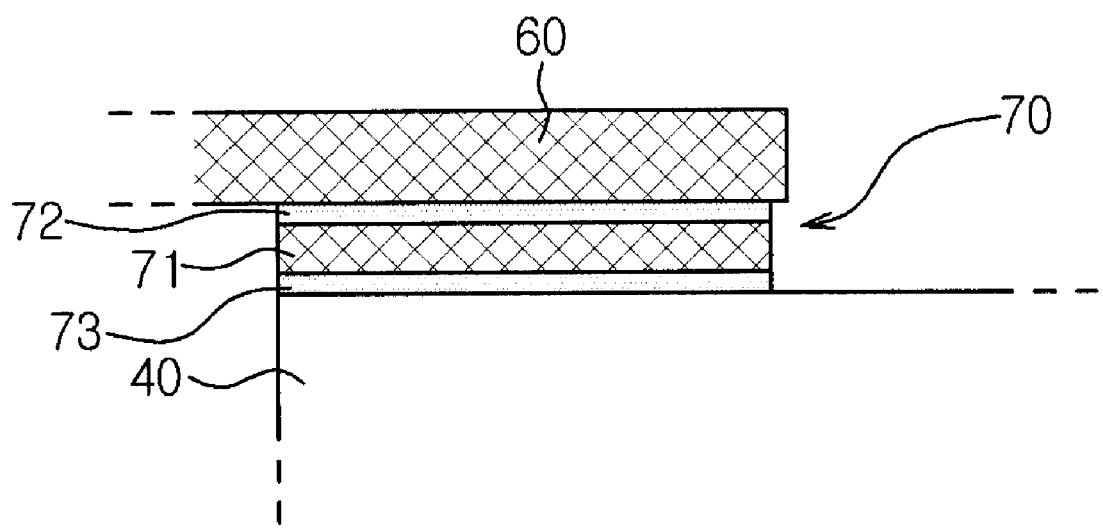
FIG. 4 is a detailed view of a bonding tape of the plasma display device.

Referring to FIG. 4, the bonding tape 70 comprises a woven layer 71 of the conductive fiber, and adhesive layers 72 and 73 formed on both sides of the woven layer 71. The adhesive layers 72 and 73 are formed of acryl-based adhesives, and comprise a conductive metal powder to prevent leakage of the electromagnetic waves. Thus, when the shielding members 60 are bonded to the front filter 40 by use of such a bonding tape 70, it is possible to prevent the shielding members 60 from being separated from the front filter 40 and to prevent the electromagnetic waves from being leaked through a bonded part.

Referring to FIG. 2, an elastic member 80 is interposed in a coupling part between the front frame 20 and the rear cover 30 to force the shielding members 60 to be brought into close contact with the inner surface of the rear cover 30. The elastic member 80 may be formed of a material such as rubber or silicone, which has stretchability. Preferably, the elastic member 80 is formed of a sponge to reduce the weight of the display device. With this configuration, the elastic member 80 forces the shielding members 60 to be brought into close contact with the rear cover 30, preventing the electromagnetic waves from being leaked through a gap between the rear cover 30 and the shielding members 60.

There will be described a method for assembling the plasma display device as follows.

First, a front filter 40 is positioned on an inner surface of a front frame 20 to face an opening 21 of the front frame 20. Here, the front filter 40 is supported in such a way that a front side of the front filter 40 near the periphery thereof is supported by the front frame 20 and the periphery of the front filter 40 is supported by a support rim 23.

After positioning the front filter 40, shielding members 60 are bonded to the rear side of the front filter 40 near the periphery thereof by use of a conductive bonding tape 70. After bonding the shielding members 60, a PDP module 10 is installed. Here, the PDP module 10 is installed in such a way that a front periphery of the plasma display panel 11 is brought into close contact with the rear side of each shielding member 60. With this configuration, the front filter 40 is supported so as not to be pushed rearward by the PDP module 10 so that the front filter 40 can be secured without a separate fixing means. In other words, the front filter 40 can be stably secured by means of the front frame 20, the support rim 23, and the PDP module 10 which support the front side, the periphery and the rear side of the front filter 40, respectively.

As such, since the rear side of the front filter 40 is supported by the PDP module 10 in the plasma display device of this invention, the front filter 40 can be secured without filter supporters of a conventional plasma display device. Thus, according to the present invention, it is possible to eliminate a screw fastening operation which has been performed for installation of the filter supporters, so that the plasma display device can be manufactured by a simple assembling process. In addition, according to the present invention, the filter supporters of the metallic material are removed from the plasma display panel, thereby reducing the weight of the plasma display device.

After installing the PDP module 10, an elastic member 80 is positioned corresponding to fastening bosses 22 of the front frame 20, and one end of each shielding member 60 is positioned on the elastic member 80. At this time, since the shielding members 60 can be flexed and deformed, it is easy to manipulate the shielding members 60. After positioning the elastic member 80 and the shielding members 60, the assembly operation is completed by placing the rear cover 30 and fastening screws 31, as show in FIG. 2.

As apparent from the above description, the plasma display device according to the present invention comprises the front filter positioned on the front frame and supported by the PDP module, and the shielding members of the conductive fiber positioned along the periphery of the front frame so that the front filter can be stably supported without the filter supporters of the conventional plasma display device while preventing electromagnetic interference.

In addition, according to the present invention, the inventive plasma display device is reduced in the number of components through elimination of plural screws, enabling reduction in manufacturing costs and improvement in productivity of assembly.

Furthermore, the inventive plasma display device does not employ the filter supporters, reducing the weight of the plasma display device.

Furthermore, in the inventive plasma display device, each of the shielding members has one end bonded to the front filter by the conductive boding tape, and the other end brought into close contact with the rear cover by means of the elastic member interposed in the coupling part between the front frame and the rear cover, thereby allowing easy installation of the shielding members while ensuring prevention of the electromagnetic interference.

Although few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. A plasma display device, comprising:
    a PDP module;
    a front frame positioned in front of the PDP module and having an opening;
    a rear cover covering a rear side of the PDP module to shield electromagnetic waves;
    a front filter positioned so that a front side thereof to faces the opening of the front frame to shield the electromagnetic waves; and
    a shielding member positioned along a periphery of the PDP module, so that a front periphery of the PDP module is in contact with the shielding member, wherein the shielding member includes a conductive fiber with flexibility and containing a metallic component to shield the electromagnetic waves,
    wherein the front frame comprises a support rim extending from an inner surface of the front frame to support the periphery of the front filter, so that the front filter is stably secured by the front frame, the support rim, and the PDP module, which support the front side, the periphery and the rear side of the front filter, respectively.

2. The plasma display device according to claim 1, wherein the shielding member has one end bonded to the front filter and the other end brought into close contact with the rear cover.

3. The plasma display device according to claim 2, wherein the conductive fiber has a surface on which the metallic component is coated.

4. The plasma display device according to claim 2, wherein the conductive fiber comprises a woven layer containing the metallic component.

5. The plasma display device according to claim 2, further comprising:
    a conductive bonding tape to bond the shielding member to the front filter.

6. The plasma display device according to claim 5, wherein the bonding tape comprises a woven layer of the conductive fiber, and an adhesive layer formed on either side of the woven layer and comprising a conductive metal powder.

7. The plasma display device according to claim 2, further comprising:
    an elastic member interposed in a coupling part between the rear cover and the front frame to force the shielding member to be brought into close contact with an inner surface of the rear cover.

8. The plasma display device according to claim 7, wherein the elastic member is a sponge.

9. A plasma display device, comprising:
    a PDP module;
    a front frame positioned in front of the PDP module and having an opening;
    a rear cover covering a rear side of the PDP module to shield electromagnetic waves;
    a front filter positioned to face the opening of the front frame to shield the electromagnetic waves; and
    a shielding member positioned along a periphery of the PDP module to shield the electromagnetic waves, the shielding member including a conductive fiber with flexibility, and the shielding member having a first end bonded to a rear side of the front filter and in contact with- a front periphery of the PDP module, and a second end brought into close contact with the rear cover.

* * * * *